United States Patent
Belyansky et al.

(10) Patent No.: US 7,273,638 B2
(45) Date of Patent: *Sep. 25, 2007

(54) HIGH DENSITY PLASMA OXIDATION

(75) Inventors: Michael Belyansky, Bethel, CT (US); Oleg Glushenkov, Wappingers Falls, NY (US); Andreas Knorr, Austin, TX (US)

(73) Assignees: International Business Machines Corp., Armonk, NY (US); Infineon Technologies, North American Corp., San Jose, CA (US)

(*) Notice: Subject to any disclaimer, the term of this patent is extended or adjusted under 35 U.S.C. 154(b) by 691 days.

This patent is subject to a terminal disclaimer.

(21) Appl. No.: 10/338,254

(22) Filed: Jan. 7, 2003

(65) Prior Publication Data

US 2004/0129673 A1    Jul. 8, 2004

(51) Int. Cl.
| | |
|---|---|
| H05H 1/46 | (2006.01) |
| B05D 3/06 | (2006.01) |
| B05D 3/14 | (2006.01) |
| C23C 16/40 | (2006.01) |
| C23C 16/505 | (2006.01) |
| H01L 21/473 | (2006.01) |
| C23C 16/509 | (2006.01) |

(52) U.S. Cl. ............... 427/539; 427/579; 427/563; 438/788

(58) Field of Classification Search ............... 427/535, 427/536, 537, 538, 539, 540, 562, 563, 564, 427/569, 576, 579, 580; 438/770, 771, 772, 438/773, 774, 787, 788

See application file for complete search history.

(56) References Cited

U.S. PATENT DOCUMENTS

| | | | |
|---|---|---|---|
| 4,232,057 A | 11/1980 | Ray et al. | |
| 4,323,589 A | 4/1982 | Ray et al. | |
| 4,474,829 A | 10/1984 | Peters | |
| 4,585,668 A * | 4/1986 | Asmussen et al. | 438/478 |
| 5,330,935 A | 7/1994 | Dobuzinsky et al. | |
| 5,443,863 A | 8/1995 | Neely et al. | |

(Continued)

OTHER PUBLICATIONS

George Dieter, Mechanical Metallurgy, second edition, McGraw-Hill, Inc., USA, 1976 (no month), excerpts pp. 106-110.*

(Continued)

*Primary Examiner*—Marianne Padgett
(74) *Attorney, Agent, or Firm*—DeLio & Peterson, LLC; Peter W. Peterson; Todd M. C. Li

(57) ABSTRACT

A method of oxidizing a substrate having area of about 30,000 mm$^2$ or more. The surface is preferably comprised of silicon-containing materials, such as silicon, silicon germanium, silicon carbide, silicon nitride, and metal suicides. A mixture of oxygen-bearing gas and diluent gas normally non-reactive to oxygen, such as Ne, Ar, Kr, Xe, and/or Rn are ionized to create a plasma having an electron density of at least about 1e12 cm$^{-3}$ and containing ambient electrons having an average temperature greater than about 1 eV. The substrate surface is oxidized with energetic particles, comprising primarily atomic oxygen, created in the plasma to form an oxide film of substantially uniform thickness. The oxidation of the substrate takes place at a temperature below about 700° C., e.g., between about room temperature, 20° C., and about 500° C.

19 Claims, 2 Drawing Sheets

U.S. PATENT DOCUMENTS

| | | | |
|---|---|---|---|
| 5,614,055 A | 3/1997 | Fairbairn et al. | |
| 5,872,052 A | 2/1999 | Iyer | |
| 5,913,149 A | 6/1999 | Thakur et al. | |
| 5,923,948 A | 7/1999 | Cathey, Jr. | |
| 6,037,273 A | 3/2000 | Gronet et al. | |
| 6,051,100 A | 4/2000 | Walko, II | |
| 6,149,987 A * | 11/2000 | Perng et al. | 427/579 |
| 6,165,834 A | 12/2000 | Agarwal et al. | |
| 6,287,988 B1 * | 9/2001 | Nagamine et al. | 438/770 |
| 6,357,385 B1 * | 3/2002 | Ohmi et al. | 118/723 AN |
| 6,358,867 B1 | 3/2002 | Tews et al. | |
| 6,534,421 B2 * | 3/2003 | Kakkad | 438/771 |
| 6,794,242 B1 * | 9/2004 | Dyer et al. | 438/244 |
| 6,900,138 B1 * | 5/2005 | Yin et al. | 438/725 |
| 7,012,311 B2 * | 3/2006 | Ohmi et al. | 257/410 |
| 2004/0113227 A1 * | 6/2004 | Goto et al. | 257/506 |
| 2005/0250338 A1 * | 11/2005 | Ohmi et al. | 438/726 |
| 2006/0105114 A1 * | 5/2006 | White | 427/569 |
| 2006/0105516 A1 * | 5/2006 | Belyansky et al. | 438/199 |

OTHER PUBLICATIONS

Gluschenkov et al., "Orientation Independent Oxidation of Nitrided Silicon," U.S. Appl. No. 10/284,508, filed Oct. 29, 2002.

* cited by examiner

HIGH DENSITY PLASMA OXIDATION

BACKGROUND OF THE INVENTION

1. Field of the Invention

The present invention relates to a method and system for oxidizing surfaces and, in particular, is directed to oxidizing silicon-containing and other semiconductor wafers in a high-density plasma chemical vapor deposition tool.

2. Description of Related Art

In general, an oxidation process is performed by heating wafers in an ambient of oxygen-bearing gas. Typical oxygen-bearing gases are molecular oxygen $O_2$, water vapors $H_2O$, nitrous oxide $N_2O$, nitric oxide NO, and ozone $O_3$. Oxidation reactors can be roughly divided into single wafer tools and furnaces. A typical oxidation furnace processes many wafers at once. Modern oxidation furnaces can process 100-200 200-mm-diameter wafers in one batch. Due to the large batch size, the furnaces can support relatively slow processes without affecting throughput. A typical furnace throughput is 50-100 wafers per hour. On the other hand, single wafer tools process one wafer at a time. Single wafer tools allow for a greater manufacturing flexibility, for they can support a different process per given wafer. A manufacturing facility that processes a large mix of different products can greatly benefit from the flexibility of single wafer oxidation tools. In order to support a competitive throughput as compared to that of a furnace, single wafer tools employ fast oxidation processes. A typical throughput of a single wafer oxidation tool is 20-40 wafers per hour. Single wafer oxidation processes longer than 5 minutes are highly undesirable. In fact, a preferred single wafer process is less than 2 minute long.

General trends in micro- and nanofabrication are directed to the reduction of thermal budget, processing of large substrates, and increased three-dimensional integration. Reduced thermal budget allows for sharp dopant profiles and prevents chemical reaction and intermixing between adjacent dissimilar materials. Consequently, the device features can be made smaller without loss of structural integrity. Larger substrates allow for more devices to be manufactured per given processing sequence. As the result, the manufacturing cost per given device is reduced. Integration of various devices into the third dimension (perpendicular to the wafer surface) offers even greater device density.

One way to speed up the oxidation process is to use a highly reactive oxygen-bearing gas that can rapidly react with the substrate at a low temperature. The most reactive oxygen-bearing gas is free oxygen radical or atomic oxygen. In order to produce a substantial amount of atomic oxygen, one has to dissociate more stable oxygen-bearing gas (e.g. $O_2$, $O_3$, NO, $N_2O$) with the aid of some excitation. The excitation can be in the form of electrical discharge, flux of photons (photo assisted), electron beam, or localized intense heat. The atomic oxygen is inherently unstable substance and may quickly recombine without reaching the substrate. Furthermore, providing a uniform distribution of atomic oxygen over relatively large substrate (200-mm in diameter and larger) is a challenge. Accordingly, the atomic oxygen has to be first produced with the aid of some excitation, than delivered to the substrate with minimal recombination losses, and finally redistributed over the substrate surface in a manner that ensures an acceptable uniformity of the process.

There are several known processes and tools that employ atomic oxygen for a fast, low temperature oxidation process. A low temperature, charge-free process for forming oxide layers was disclosed in U.S. Pat. No. 4,474,829, which utilized an oxygen-containing precursor and exposed it to radiation of a selected wavelength to cause direct dissociation to generate oxygen solely in atomic form. However, this process is relatively complex and requires specially-built tools, not readily commercially available tools such as an RTO oxidation tool.

Gronet et al. U.S. Pat. No. 6,037,273 discloses an apparatus to carry out an in-situ steam generation (ISSG) oxidation technique. Gronet discloses that the in-situ steam generation rapid thermal processor (a single wafer tool) is well suited for high volume semiconductor manufacturing due to a superior temperature uniformity, fast temperature ramps, high throughput, and acceptable safety record. Gronet discloses that a substrate can be placed in such a reactor and then oxidized using the in-situ generated steam. Gronet discloses a fast oxidation of a substrate having a Si layer. Tews et al. U.S. Pat. No. 6,358,867 teaches that the oxidation process conducted in in-situ steam generation rapid thermal processor shows little orientation dependence. Tews et al. teaches that the absence of orientation dependence is the earmark of atomic oxidation. Tews et al. refers to the ISSG oxidation technique as free radical enhanced rapid thermal oxidation (FRE RTO). In a related application Ser. No. 09/874,144, Ballantine et al. teaches that the ISSG process is capable of rapidly oxidizing very stable silicon nitride. Ballantine et al. teaches that the rapid oxidation of SiN can be only performed with the aid of some excitation.

Oxidation by use of plasmas has also been disclosed in U.S. Pat. Nos. 4,232,057, 4,323,589, 5,330,935, 5,443,863, 5,872,052, 5,913,149, 5,923,948 and 6,165,834. While the disclosed plasma oxidation methods have shown some promise, they have resulted in relatively low oxide growthrate, have been limited to relatively small substrate surface areas or low density plasma (which gives poor throughput for thicker films) or have had other problems which have made them unable to compete with the commercially available RTO oxidation tools.

FRE RTO or ISSG process can provide substantial amount of atomic oxygen over 200-mm substrate resulting in a number of useful atomic oxidation processes such as orientation independent oxidation of silicon and fast oxidation of silicon nitride. Nevertheless, the process is limited the high substrate temperature (above 600C) because the atomic oxygen is generated within the chamber as a secondary byproduct of multi-step reaction between hydrogen H2 and oxygen O2. Furthermore, safety requirements limit the process substrate temperature to even higher temperature (above 800C). This temperature range is relatively high compare to the atomic oxidation processes where the radicals are created in a plasma discharge.

SUMMARY OF THE INVENTION

Bearing in mind the problems and deficiencies of the prior art, it is therefore an object of the present invention to provide a method and system for oxidizing substrates which has relatively high oxide growth rate and utilizes relatively inexpensive reactants.

It is another object of the present invention to provide a method and system for oxidizing substrates which utilize readily available tools utilized in the semiconductor industry.

A further object of the invention is to provide a method and system for oxidizing a semiconductor substrate which may be used for relatively large substrates, for example wafers of at least 200 mm in diameter.

It is yet another object of the present invention to provide a method and system for oxidizing a semiconductor substrate which results in a high degree of oxide uniformity across the surface.

It is yet another object of the present invention to provide a method for oxidizing a semiconductor substrate which may be performed at relatively low temperatures.

The above and other objects and advantages, which will be apparent to one of skill in the art, are achieved in the present invention which is directed to, in a first aspect, a method of oxidizing a substrate using a plasma comprising providing a large-area substrate with area of about 30,000 mm$^2$ or more having a surface capable of being converted to an oxide and providing a mixture of oxygen-bearing gas and diluent gas normally non-reactive to oxygen. The oxygen and diluent gas mixture are ionized to create a plasma having an electron density of at least about 1e12 cm$^{-3}$ and the substrate surface is oxidized with energetic particles created in the plasma to form an oxide film of substantially uniform thickness.

The oxygen gas may comprise between about 10% and 95% of the mixture by mole fraction and the diluent gas may comprise between about 90% and 5% of the mixture by mole fraction and may be Ne, Ar, Kr, Xe, and/or Rn. The energetic particles comprise primarily atomic oxygen and the plasma contains ambient electrons having an average temperature greater than about 1 eV. Preferably, the oxidation of the substrate takes place at a temperature below about 700° C., and more preferably takes place at a temperature between about room temperature, 20° C., and about 500° C.

While the substrate can be comprised of various materials and can contain various structures, preferably, the substrate surface is comprised of a silicon-containing material, such as silicon, silicon germanium, silicon carbide, silicon nitride, and/or metal silicides. The present invention provides an additional advantage when the substrate surface is comprised of dissimilar materials. The dissimilar materials may include monocrystalline silicon with different crystallographic planes, particularly, (100), (110) or (111) planes. The dissimilar property of material can also be due to a different level of doping or doping type. According to present invention, an oxide film grown on dissimilar materials is of substantially the same thickness. The oxide thickness variation from material to material is less than 20% while the oxide thickness variation over entire substrate surface made of one type of material is less than 2% at 1σ standard deviation.

In another aspect, the present invention is directed to a method of oxidizing a substrate using high density plasma comprising providing a high density plasma reactor, placing a substrate with an area of at least about 30,000 mm$^2$ and having a surface capable of being converted to an oxide in the reactor, and introducing a mixture of oxygen gas and a diluent gas normally non-reactive to oxygen into the reactor. The oxygen and diluent gas mixture is ionized to create a plasma having an electron density of at least about 1e12 cm$^3$ and the substrate surface is oxidized with energetic particles created in the plasma to form an oxide film with the thickness range of 20% or less of the target thickness.

In a further aspect, the present invention provides a high density plasma reactor system for oxidizing a substrate comprising a containment structure for creating and maintaining a plasma and a substrate with an area of at least about 30,000 mm$^2$ and having a surface capable of being converted to an oxide within the containment structure. The system includes a plasma, over the surface of the substrate, created from a mixture of oxygen gas and a diluent gas normally non-reactive to oxygen, the plasma having an electron density of at least about 1e12 cm$^{-3}$, and being capable of oxidizing the substrate surface with energetic particles created in the plasma to form an oxide film with the thickness range of 20% or less of the target thickness.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
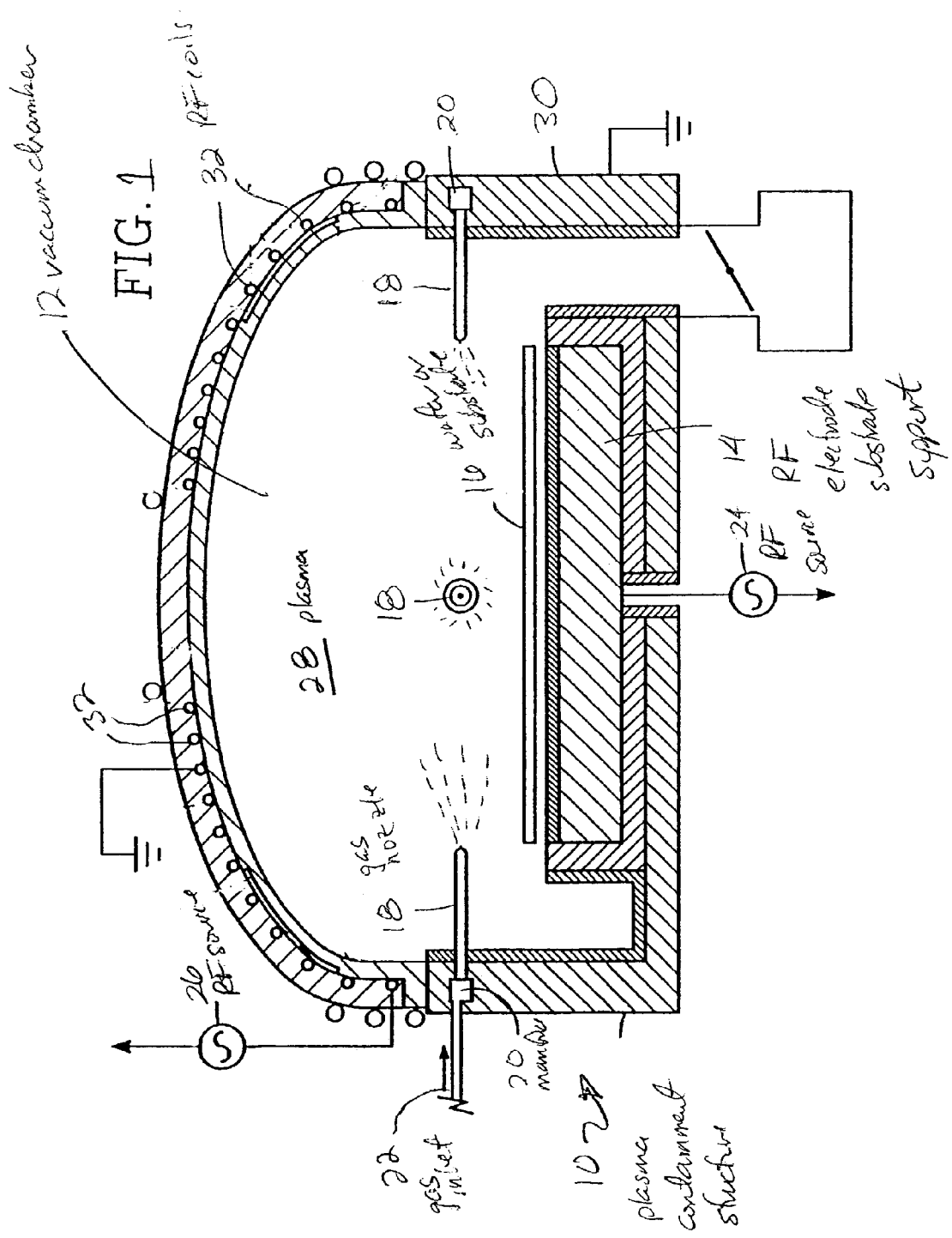
FIG. 1 is a side elevational view, in cross section, of a high-density plasma containment vessel or reactor which is useful in practicing the present invention.

In describing the preferred embodiment of the present invention, reference will be made herein to FIGS. 1 and 2 of the drawings in which like numerals refer to like features of the invention. Features of the invention are not necessarily shown to scale in the drawings.

The present invention provides a method and system for oxidizing semiconductor substrates which utilizes a readily commercially available high density plasma reactor of the type normally used for chemical vapor deposition (CVD). The substrate or wafer can be comprised of either conductors (e.g., elemental metals, metal suicides, certain metal nitrides, and the like), semiconductors (e.g., Si, Ge, SiGe, SiC, SiGeC, or any of III-V or II-VI compounds), insulators and insulating ceramics (e.g. glass, sapphire, silicon nitride, boron nitride, etc.), and polymers. The substrate can have multiple layers of these materials (e.g. silicon-on-insulator (SOI) and silicon-germanium-on-insulator (SGOI) substrates, strained silicon substrates and others). Materials on the substrate surface can be in polycrystalline, monocrystalline, or amorphous form, doped or undoped. The substrate can contain various useful structures such as isolation structures including isolation trenches, differently doped areas including transistor wells, capacitors including trench and stack capacitors, transistors, interconnects, optical devices, micro electromechanical systems (MEMS), and other structures. The substrate structures can have planar or three-dimensional geometry. The preferred substrate surface includes silicon-containing materials such as such as silicon, silicon germanium, silicon carbide, silicon nitride, and/or metal silicides. The method utilizes a relatively low temperature budget oxidation and results in an oxidation rate similar to that of commercial RTO oxidation tools.

As shown in FIG. 1, a standard CVD high density plasma tool comprises a reactor 10 having a containment structure 30 which encloses a vacuum chamber 12 therewithin. The wafer or substrate 16 to be oxidized sits upon a support which is also a radio frequency (RF) electrode 14, connected to an RF source 24. The presence of an independent substrate bias is optional. The wafer support stage may also include a wafer heater with its power supply, wafer temperature sensor, and controlling circuitry (not shown). The surface of the wafer 16 to be oxidized is normally facing upward into the interior of the chamber 12. A gas inlet 22 is connected to a gas manifold 20 extending around chamber 12, which manifold is further connected to a plurality of nozzles 18 that direct gas from the manifold into the chamber 12. A number of RF coils 32 connected to an RF source 26 extend around the generally hemispherical top of reactor 10. The RF source 26 is typically connected to coils 32 via an impedance matching network (not shown). The plasma is created in the vicinity of coils 32. The plasma zone can be optionally separated from the substrate by dividing the chamber with a plate containing a plurality of holes (not shown). The plasma is then confined in the upper portion of the reactor. The energetic particles created in the plasma effuse through the plate holes, reach the substrate surface, and react with it. Such plate is often called showerhead. Showerhead hole dimension can vary to offset varying gas conductance over a large substrate thus improving process uniformity. A Faraday shield (not shown) may be inserted in between the coils 32 and the plasma to minimize capacitive coupling from the coil. The capacitive coupling may result into chamber or wafer damage associated with high-energy ions.

The substrate whose surface may be oxidized in accordance with the present invention may be any material which has a surface which may be converted to a thermal oxide. The present invention is particularly suitable for silicon-containing materials such as silicon, silicon germanium, silicon carbide, silicon nitride, and/or metal silicides. In the case of silicon crystal, its surface to be converted to an oxide can have multiple crystallographic planes, for example (100), (110), or (111) planes. In accordance with the present invention, the thermal oxide grown on these planes is essentially of the same thickness, thus having an orientation independent oxidation property. Furthermore, in accordance with the present invention, the speed of oxidation of silicon nitride is similar to that of crystalline silicon showing that the inventive method oxidizes widely dissimilar materials with essentially the same speed. This universally isotropic oxidation property of the inventive method allows for growing a relatively uniform thermal oxide on different materials. For instance, a uniform layer of silicon oxide can be grown over a three dimensional structure with its surface comprised of different crystallographic planes of silicon crystal and silicon nitride isolation layers. The substrate is normally present in the form of a circular wafer, and the present invention has been found to be particularly useful where the wafer diameter is on the order of 200 mm or more, providing a total area of at least about 30,000 mm$^2$.

The method of the present invention utilizes an oxygen-bearing gas such as molecular oxygen ($O_2$) gas, along with a diluent gas. Preferably, the diluent gas is an inert gas, and is more preferably a heavy-molecule noble gas such as argon. The mixture of the oxygen and diluent gas preferably comprises about 10% and 95% by (mole fraction) of oxygen and between about 90% and 5% by (mole fraction) of the diluent gas. The mixture is then excited in a high-density (electron concentration of about 1e12 cm$^{-3}$ or more) electrical discharge to yield oxygen radicals. The oxygen radicals support the oxidation process. Their concentration and its uniformity near the wafer surface affect the speed and uniformity of the oxidation process, respectively. It has been discovered that a 100% oxygen atmosphere in the plasma reactor does not provide the desired high oxidation rate. In addition, it has been found that mixing a light noble gas such as helium He with oxygen does not result in a substantial increase of the oxidation rate. Unexpectedly, it has been found that a mixture of argon and oxygen results in a relatively high oxide growth rate that is at least about 50 Å/min as judged by the final film thickness. Due to a non-linear (mostly square root) dependence of the oxide thickness on the oxidation time for atomic oxidation processes, it is more correctly to operate with a differential growth rate (an increment of oxide film thickness per given oxidation period). The differential growth rate of 0.25-1 Å/sec for 50-150 Å thick films has been achieved. This rate is comparable to that of a typical RTO process albeit at a much lower temperature. Typically, a mixture of 75% (by mole fraction) of O2 and 25% (by mole fraction) of argon is most desirable, although a lower percentage of the argon, down to about 5% by mole fraction is believed useful. The preferred minimum amount of oxygen in the mixture is at least 20% (by mole fraction). Other heavy-molecule noble gases such as Ne, Kr, Xe, and Rn are believed to result into a similar increase of atomic oxygen generation in a high-density plasmas.

In practice, after the reactor 10 has been evacuated, the mixture of oxygen and diluent gas is introduced via gas nozzles 18, the reactor pressure is maintained at a low pressure of from about 0.1 mTorr to about 30 Torr, and plasma is created and maintained by the electromagnetic energy supplied by means of inductive coupling between the RF coils 32 and the ionized gas mixture. The coils 32 are driven by a radio frequency power supply via a matching network. The matching network minimizes electromagnetic power reflection by matching electrical impedances of coupled coil-plasma system and a power supply cable. The electromagnetic power is primarily deposited into the plasma electrons. The electrons then collide with other particles causing various electronic and vibrational excitation, ionization, and dissociation processes. The excited particles can collide causing new excitation states and/or contributing to the existing energetic particles. Subsequently, the electromagnetic power is divided among numerous excited particles. Only a relatively stable excited particle can participate is the oxidation process that involves diffusion through a solid state film. While ions and molecules excited to various electronic states recombine upon a single collision with solid state surface, oxygen radicals can survive many such encounters. While not wishing to be bound by theory, it is believed that atomic oxygen is created from the gas mixture to form energetic particles which cause the formation of thermal oxide on the surface of the substrate. The proximity of the plasma to the wafers surface is not that important as long as the atomic oxygen can diffuse from the plasma zone without substantial losses and without affecting its uniformity across the wafer surface. It is also believed that the plasma ambient within chamber 12 contains atomic oxygen with the fraction of dissociation of higher than 20%.

A preferred high plasma density i.e., a plasma having a number density of electrons at about 1e12 cm$^{-3}$ or more, is related to the deposited power density or at least 0.5 W/cm$^2$ or more. The deposited power density can be determined by dividing the deposited power by the reactor area covered by coils 32. In turn, the deposited power can be determined from the power delivered to the matching network (the power setting of the reactor with negligible reflected power) multiplied by the power efficiency of inductive coupling system. A typical power efficiency of inductive coupling in such reactors is from 0.1 to 0.9, that is between 10% and 90% of the power delivered to the matching network is actually deposited into the plasma while the rest is dissipated in the coils 32 and the matching network. The oxidation was also performed at a relatively low temperature, i.e., less than about 700° C., and greater than about room temperature 20° C. The preferred temperature range is between about room temperature 20° C. and about 500° C., more preferably less than 400° C., most preferably about 300° C. It has also been found useful where the plasma ambient electrons have an average temperature of higher than 1 eV. As will be appreciated by those skilled in the plasma art, these conditions may be affected by chamber geometry, particular plasma mixture, deposited power settings and other parameters. The optimum parameters may be determined without undue experimentation.

The oxidation reaction is carried on in the reactor until the desired thickness of oxide is formed on the substrate surface. The present invention has been found to result in relatively fast oxide layer differential growth rates of 0.25-1 Å/sec. at approximately 300° C. reaction temperature. Such fast differential oxidation rate can support a single wafer oxidation process of less than 5 minutes per wafer and typically about 2 minutes per wafer while growing a relatively thick oxide film of 50-200 Å. The present invention results in a relatively good quality oxide, which may be useful for forming e-fuses, hard, mask layers, sidewall oxides, isolation oxides and the like on various silicon-containing materials often combined on the same substrate. In addition, other materials such metals, metal nitrides, metal oxides, compound semiconductors (typically III-V or II-VI semiconductor) and various polymers can be oxidized with this method at very low temperature to create useful oxide-based structures.

The present invention also results in a relatively high uniformity of oxide thickness wherein the energetic particles created in the plasma are capable of forming an oxide film with the thickness range of 20% or less of the target thickness on dissimilar materials, and 1σ standard deviation of thickness variation less than about 2% over entire wafer surface of one material type.

Figure 2:
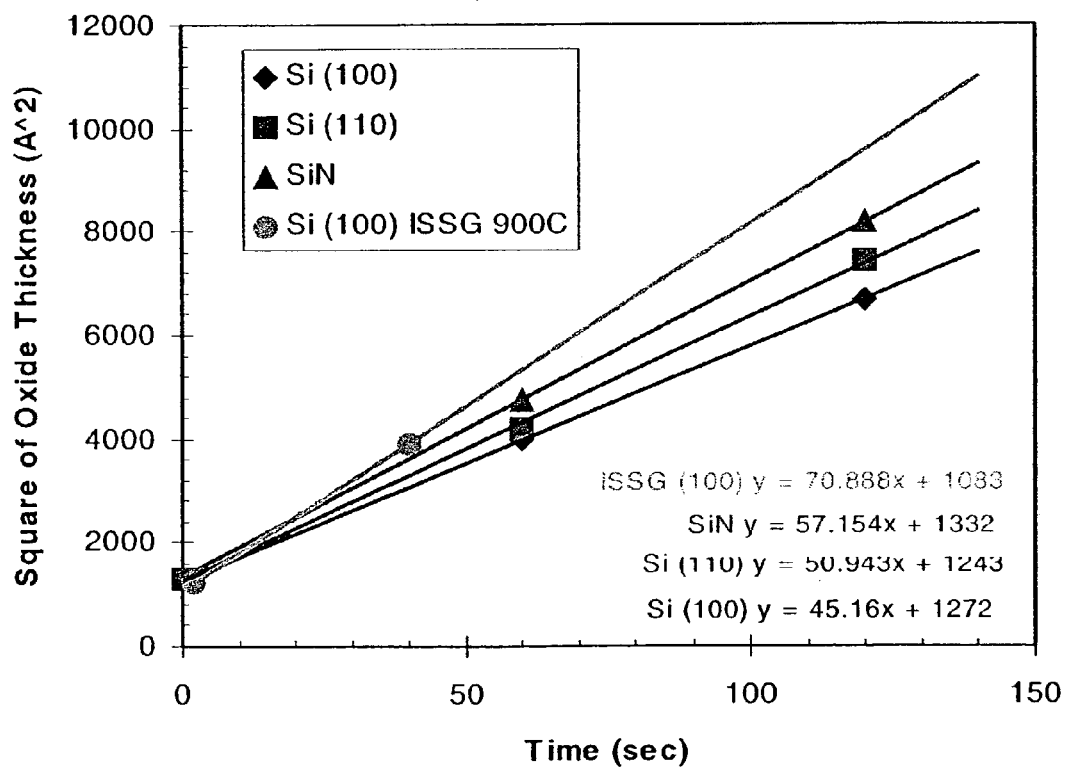
FIG. 2 is graphical representation of a comparison of the oxide growth rate of the present invention on three different substrates, as compared to a prior art oxidation method.

A comparison of oxidation by the present invention with the prior art is depicted in FIG. 2. The graph therein compares the time of oxidation reaction on the x-axis with the square of oxide thickness in Å$^2$ on the y-axis. As can be seen, the rates of oxide formation for the present invention at approximately 350C on silicon nitride, monocrystalline silicon on the (100) and (110) crystalline faces compares favorably with the rate for the prior art ISSG (FRE RTO) processes on monocrystalline silicon on the (100) face at 900C.

Thus the present invention achieves the objects recited above and provides a high oxidation rate at a relatively low temperature budget utilizing existing and readily available high density plasma tools normally employed for chemical vapor deposition.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of oxidizing a substrate using a radio frequency plasma reactor, the substrate having a substrate surface comprised of dissimilar silicon-containing materials capable of being converted to an oxide and having a surface area of at least 30,000 mm$^2$, comprising:

providing a mixture of oxygen-bearing gas and diluent gas normally non-reactive to oxygen, the diluent gas being selected from the group consisting of Ne, Ar, Xe, and Rn;

ionizing the oxygen and diluent gas mixture in the radio frequency plasma reactor to create a plasma having an electron density of at least 1e12 cm$^{-3}$, the ionized oxygen and diluent gas mixture forming energetic particles including atomic oxygen in the plasma; and oxidizing said substrate surface with the energetic particles created in the plasma to form an oxide film of substantially uniform thickness such that oxide film thickness variation between the dissimilar materials is less than 20%.

2. The method of claim 1 wherein said energetic particles comprise primarily atomic oxygen.

3. The method of claim 1 wherein the oxygen gas comprises between 10% and 95% of the mixture by mole fraction.

4. The method of claim 1 wherein the diluent gas comprises between 90% and 5% of the mixture by mole fraction.

5. The method of claim 1 wherein the oxidation of the substrate takes place at a temperature below 700° C.

6. The method of claim 1 wherein the oxidation of the substrate takes place at a temperature of between 20° C. and 500° C.

7. The method of claim 1 wherein the plasma contains ambient electrons having an average temperature greater than 1 eV.

8. The method of claim 1, wherein the dissimilar silicon-containing materials are selected from the group consisting of silicon, silicon germanium, silicon carbide, silicon nitride, and metal silicides.

9. The method of claim 1 wherein the dissimilar silicon-containing materials are monocrystalline silicon having multiple crystallographic planes.

10. The method of claim 9 wherein the multiple crystallographic planes include at least two of the following crystallographic planes: (100), (110), and (111).

11. The method of claim 1 wherein the surface of the substrate converted to an oxide has a non-uniformity of less than 2% at 1σ a standard deviation for one type of material.

12. The method of claim 10 wherein the diluent gas is Ar, and the oxide film has a uniform thickness of between 50 and 200 Å.

13. A method of oxidizing a substrate using high density radio frequency plasma reactor to a target thickness, the substrate having a surface comprised of dissimilar silicon-containing materials capable of being converted to an oxide and having a surface area of at least 30,000 mm$^2$, comprising:

providing a high density radio frequency plasma reactor;
placing said substrate in said reactor;
introducing a mixture of oxygen gas and a diluent gas normally non-reactive to oxygen into said reactor, the diluent gas being selected from the group consisting of Ne, Ar, Xe, and Rn;
ionizing the oxygen and diluent gas mixture to create a plasma having an electron density of at least 1e12 cm$^{-3}$, the ionized oxygen and diluent gas mixture forming energetic particles including atomic oxygen in the plasma; and
oxidizing the substrate surface with the energetic particles created in the plasma to form an oxide film at a rate of at least 50 Å A per minute with a thickness range of 20% or less of the target thickness over the entire substrate surface capable of being oxidized.

14. The method of claim 13 wherein the oxygen gas comprises between 10% and 95% of the mixture by mole fraction and the diluent gas comprises between 90% and 5% of the mixture by mole fraction.

15. The method of claim 14 wherein the plasma contains ambient electrons having an average temperature greater than 1 eV and said energetic particles comprise primarily atomic oxygen.

16. The method of claim 15 wherein the oxidation of the substrate takes place at a temperature of between 20° C. and 500° C.

17. The method of claim 16 wherein the dissimilar silicon-containing materials are selected from the group consisting of silicon, silicon germanium, silicon carbide, silicon nitride, and metal silicides.

18. The method of claim 17 wherein the diluent gas is Ar, and the oxide film has a uniform thickness of between 50 and 200 Å.

19. The method of claim 16 wherein the dissimilar silicon-containing materials are monocrystalline silicon having multiple crystallographic planes.

* * * * *